(12) United States Patent
Hayter

(10) Patent No.: US 6,924,683 B1
(45) Date of Patent: Aug. 2, 2005

(54) EDGE ACCELERATED SENSE AMPLIFIER FLIP-FLOP WITH HIGH FANOUT DRIVE CAPABILITY

(75) Inventor: Russell Hayter, Wyoming (AU)

(73) Assignee: Integrated Device Technology, Inc., Santa Clara, CA (US)

( * ) Notice: Subject to any disclaimer, the term of this patent is extended or adjusted under 35 U.S.C. 154(b) by 39 days.

(21) Appl. No.: 10/741,761

(22) Filed: Dec. 19, 2003

(51) Int. Cl.$^7$ .......................... H03K 3/037; H03K 3/12
(52) U.S. Cl. ...................................... 327/218; 327/212
(58) Field of Search .......................... 327/51–52, 54–57, 327/64, 76, 82, 89, 97, 112, 199–200, 208, 210–215, 217–219; 365/204–207

(56) References Cited

U.S. PATENT DOCUMENTS

| | | | |
|---|---|---|---|
| 4,195,239 A | | 3/1980 | Suzuki |
| 5,940,331 A | * | 8/1999 | Kagami .................. 365/189.05 |
| 6,021,068 A | | 2/2000 | Miki et al. |
| 6,107,853 A | | 8/2000 | Nikolic et al. |
| 6,268,747 B1 | * | 7/2001 | Barnes ......................... 327/55 |
| 6,396,309 B1 | | 5/2002 | Zhao et al. |
| 6,459,317 B1 | | 10/2002 | Lu et al. |
| 6,552,954 B2 | * | 4/2003 | Fujisawa et al. ............ 365/233 |
| 6,563,744 B2 | * | 5/2003 | Kuroki .................. 365/189.05 |
| 6,573,775 B2 | | 6/2003 | Pilling |
| 6,633,188 B1 | | 10/2003 | Jia et al. |
| 6,819,139 B2 | * | 11/2004 | Kim ............................ 326/82 |
| 2002/0140480 A1 | | 10/2002 | Lu et al. |

OTHER PUBLICATIONS

Nikolic et al., "ISSSCC / Session 16 / Paper TP 16.5, TP16.5 Sense Amplifier–Based Flip–Flop," 1999 IEEE International Solid–State Circuits Conference, pp. 282–283 and 468.

Matsui et al., "A 200 MHz 13 MM$^2$ 2–D DCT Macrocell Using Sense–Amplifying Pipeline Flip–Flop Scheme," IEEE Journal of Solid–State Circuits, vol. 29, No. 12, Dec. 1994.

* cited by examiner

Primary Examiner—My-Trang Nuton
(74) Attorney, Agent, or Firm—Myers Bigel Sibley & Sajovec PA

(57) ABSTRACT

Flip-flop devices provide fast clock-to-Q timing that exploits the pulsed nature of outputs generated by a clocked sense amplifier. These flip-flop devices include an output stage, which has a PMOS pull-up transistor and an NMOS pull-down transistor therein, and a clocked sense amplifier at an input stage. The clocked sense amplifier is configured to generate first and second data output signals (/SET and /RESET). These data output signals are provided to a signal edge acceleration stage. This signal edge acceleration stage is configured to generate the pull-up and pull-down control pulses in response to the first and second data output signals, respectively. This leading edge acceleration stage includes a pull-up buffer having an odd (even) number of inverters therein that are skewed to accelerate the leading edge of the pull-up control pulse relative to a trailing edge of the pull-up control pulse. The leading edge acceleration stage also includes a pull-down buffer having an even (odd) number of inverters therein that are skewed to accelerate the leading edge of the pull-down control pulse relative to a trailing edge of the pull-down control pulse. Accordingly, the pull-up buffer accelerates the clock-to-Q timing when driving Q high and the pull-down buffer accelerates the clock-to-Q timing when driving Q low.

20 Claims, 4 Drawing Sheets

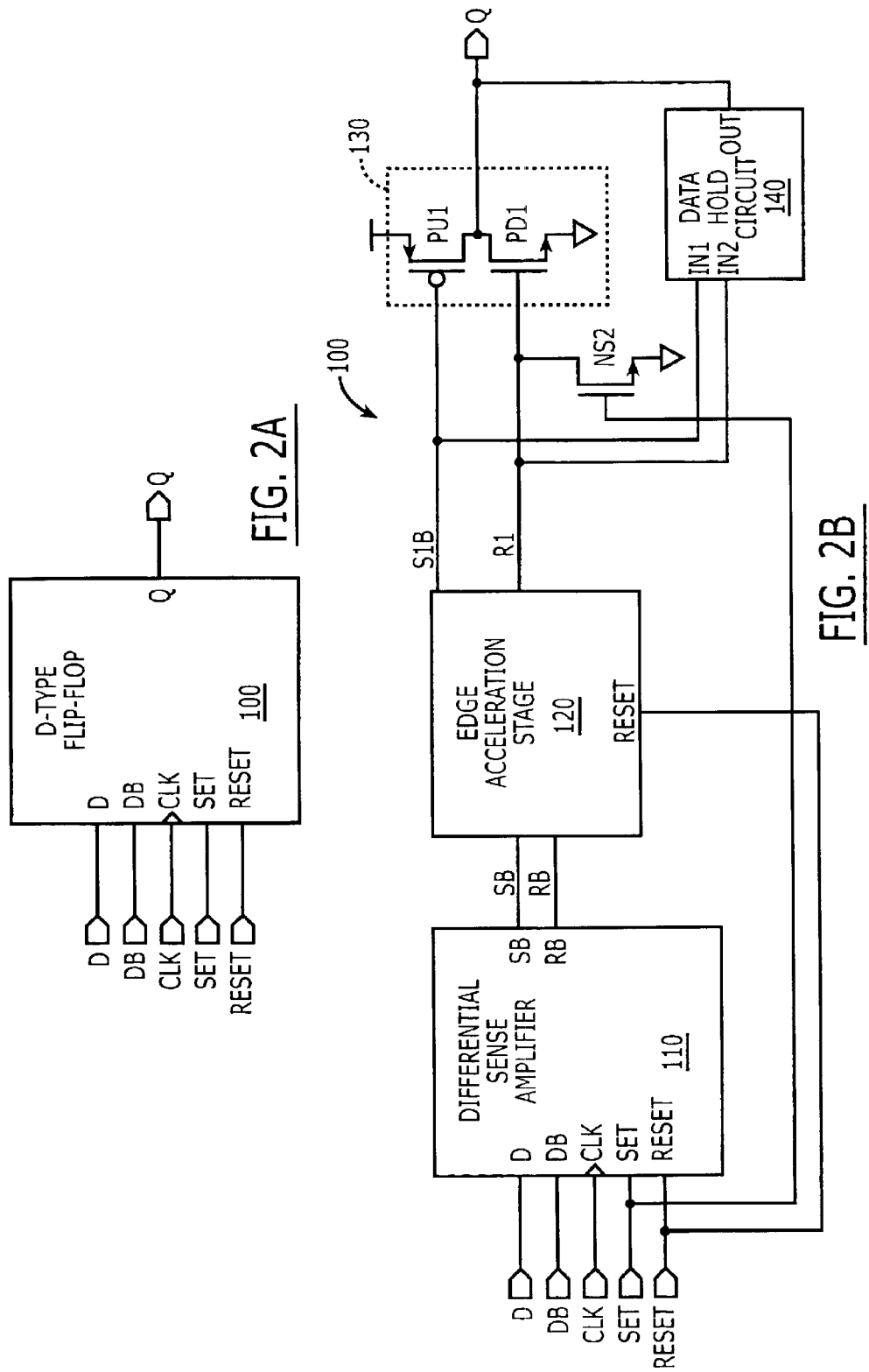

US 6,924,683 B1

EDGE ACCELERATED SENSE AMPLIFIER FLIP-FLOP WITH HIGH FANOUT DRIVE CAPABILITY

FIELD OF THE INVENTION

The present invention relates to integrated circuit devices and, more particularly, to integrated circuit devices that latch data provided to integrated circuit loads.

BACKGROUND OF THE INVENTION

Flip-flop devices are one of the fundamental building blocks of digital integrated circuits and systems. Typical high performance flip-flop devices include sense amplifier flip-flops (SAFF), hybrid latch flip-flops (HLFF) and semi-dynamic flip-flops (SDFF). One conventional sense amplifier flip-flop is described in an article by B. Nikolic et al. entitled "Sense Amplifier-Based Flip Flop," IEEE International Solid-State Circuits Conference, ISSCC99, Paper TP 16.5, pp. 282–283 and 468 (1999). As illustrated by FIG. 16.5.2 of the Nikolic et al. article, the SAFF integrates logic into the flip-flop in order to generate output signals Q and /Q having equal rising and falling transitions. This SAFF is more fully illustrated by U.S. Pat. Nos. 6,633,188 B1 and 6,107,853. U.S. Pat. No. 6,396,309 B1 to Zhao et al. discloses a clocked SAFF that utilizes a keeper unit to prevent the occurrence of a floating data node. U.S. Patent Application No. 2002/0140480 A1 to Lu et al. discloses a clocked SAFF having an input circuit, a sense amplifier and an output circuit that purportedly reduce setup time.

FIG. 1 illustrates a conventional sense amplifier flip-flop 10 that uses a series of inverters of increasing size to buffer an output signal that is generated by logic. These inverters are illustrated by the labels x, 3x and 9x to represent a factor of three scaling. As illustrated, the sense amplifier stage 12 of the flip-flop 10 is responsive to a pair of complementary data signals D and DB and a clock signal CLK. When the clock signal CLK is set to an inactive level (i.e., CLK=0), the outputs SETB (=/SET) and RESETB (=/RESET) of the sense amplifier stage 12 are driven to (or held at) logic 1 levels and the output Q of the flip-flop 10 retains its previously set state. The logic that evaluates the values of the outputs SETB and RESETB includes a pair of cross-coupled NAND gates. When the true data input D equals 1 (DB=0) and a rising edge of the clock signal CLK is received, the output SETB is switched high-to-low to trigger a leading edge of a logic 0 pulse and the output RESETB remains high. This switching event causes the output Q of the flip-flop 10 to be switched high from a previously low state (or held high if previously set high), in response to a rising edge of the clock signal CLK. In contrast, when the data input D equals 0 (DB=1) and a rising edge of the clock signal CLK is received, the output RESETB is switched high-to-low to trigger a leading edge of a logic 0 pulse and the output SETB remains high. This switching event causes the output Q of the flip-flop 10 to be switched low from a previously high state (or held low if previously set low), in response to a rising edge of the clock signal CLK.

Unfortunately, the flip-flop 10 of FIG. 1 fails to fully exploit the pulsed nature of the signals generated at the outputs of the sense amplifier 12 to thereby minimize the CLK-to-Q timing when driving the output Q high (when D=1 and a rising edge of the clock signal CLK is received) or driving the output Q low (when D=0 and a rising edge of the clock signal CLK is received). Instead, the plurality of scaled inverters at the output of the flip-flop 10 are designed to support both high-to-low and low-to-high transitions having substantially equal pull-up and pull-down slew rates. Thus, notwithstanding the sense amplifier flip-flop 10 of FIG. 1, there continues to be a need for flip-flops having better CLK-to-Q timing characteristics.

SUMMARY OF THE INVENTION

Flip-flop devices according to embodiments of the present invention can provide fast clock-to-Q timing that exploits the pulsed nature of outputs generated by a clocked sense amplifier. These flip-flop devices include an output stage having a pull-up path and a pull-down path therein that are rendered conductive in response to leading edges of pull-up and pull-down control pulses, respectively. This output stage is also configured to provide the flip-flop device with high fanout drive capability that is supported while one of the control pulses is active. Thereafter, the output stage may enter a high impedance state until the next pulse is received. The flip-flop device also includes a clocked sense amplifier at its front end. This clocked sense amplifier receives data (D and DB) from a differential data source. This data is clocked into the sense amplifier on leading edges of a clock signal CLK. The sense amplifier is configured to generate first and second data output signals, which are typically active low signals (e.g., SB=/SET and RB=/RESET). These active low signals may be treated as active low pulses that are reset to inactive high levels on each trailing edge of the clock signal CLK. For example, receipt of a leading edge of the clock signal CLK when D=1 and DB=0 may cause the first "set" output SB to switch low to an active level while the second "reset" output RB remains high at an inactive level. Thereafter, the next trailing edge of the clock signal CLK may cause the first output SB to switch back high to an inactive level. Similarly, receipt of a leading edge of the clock signal CLK when D=0 and DB=1 may cause the second output RB to switch low to an active level while the first output SB remains high at an inactive level. The next trailing edge of the clock signal CLK may cause the second output RB to switch back high to an inactive level.

A signal edge acceleration stage is provided between the sense amplifier and the output stage. This signal edge acceleration stage is configured to generate the pull-up and pull-down control pulses in response to the first and second data output signals, respectively. This leading edge acceleration stage includes a pull-up buffer having an even (odd) number of inverters therein that are skewed to accelerate the leading edge of the pull-up control pulse relative to a trailing edge of the pull-up control pulse. Thus, if the pull-up path includes a PMOS pull-up transistor, which is typical, then a falling edge of the pull-up control pulse will be skewed to have a much higher slew rate relative to a rising edge of the pull-up control pulse. The leading edge acceleration stage also includes a pull-down buffer having an odd (even) number of inverters therein that are skewed to accelerate the leading edge of the pull-down control pulse relative to a trailing edge of the pull-down control pulse. This means that if the pull-down path includes an NMOS pull-down transistor, then a rising edge of the pull-down control pulse will be skewed to have a much higher slew rate relative to a falling edge of the pull-down control pulse.

The flip-flop device also includes a data hold circuit that may be switched to a new holding state when an output of the output stage switches high-to-low or low-to-high. This data hold circuit may include a pair of cross-coupled logic gates having relatively "weak" transistors therein. These logic gates may be relatively easily overcome when the output stage is switching. In particular, the data hold circuit may have an output that is electrically coupled to the output of the output stage and first and second inputs that are responsive to the pull-up and pull-down control pulses. When the output of the output stage switches, the output of the data hold circuit is switched as well and then maintained while the output stage enters a high impedance state.

To provide equivalent pull-up and pull-down drive capability when connected to high fanout loads, a PMOS pull-up transistor within the pull-up path and an NMOS pull-down transistor within the pull-down path are typically designed to have about equal pull-up and pull-down strengths (e.g., a maximum $I_{d(sat)}$ of the PMOS transistor may be about equal to a maximum $I_{d(sat)}$ of the NMOS transistor).

In the event a ratio of a width of the PMOS pull-up transistor to a width of the NMOS pull-down transistor in the output stage equals $r_w$ (for those cases where the PMOS and NMOS transistor lengths are about equal), then the pull-up buffer may include an inverter having a PMOS-to-NMOS transistor width ratio greater than about $1.75r_w$ to thereby provide a fast low-to-high slew rate at the output of the inverter. In this case, the P:N $I_{d(sat)}$ ratio for the inverter is substantially greater than unity. Likewise, the pull-down buffer may also include an inverter having a PMOS-to-NMOS transistor width ratio greater than about $1.75r_w$. In the event the pull-up buffer consists of an even number of inverters (e.g., 2, 4, . . . ), which is typical, the first one of the even number of inverters is skewed in favor of its pull-up strength by a factor of at least 1.75 and the last one of the even number of inverters may be skewed in favor of its pull-down strength by a factor of at least 1.75. In this case, the P:N $I_{d(sat)}$ ratio for the first inverter is greater than 1.75 and the N:P $I_{d(sat)}$ ratio for the last inverter is greater than 1.75.

BRIEF DESCRIPTION OF THE DRAWINGS

FIG. 2A is a block diagram of a D-type flip-flop according to an embodiment of the present invention.

FIG. 2B is a block diagram that illustrates components of the D-type flip-flop of FIG. 2A.

DESCRIPTION OF PREFERRED EMBODIMENTS

Figure 1:
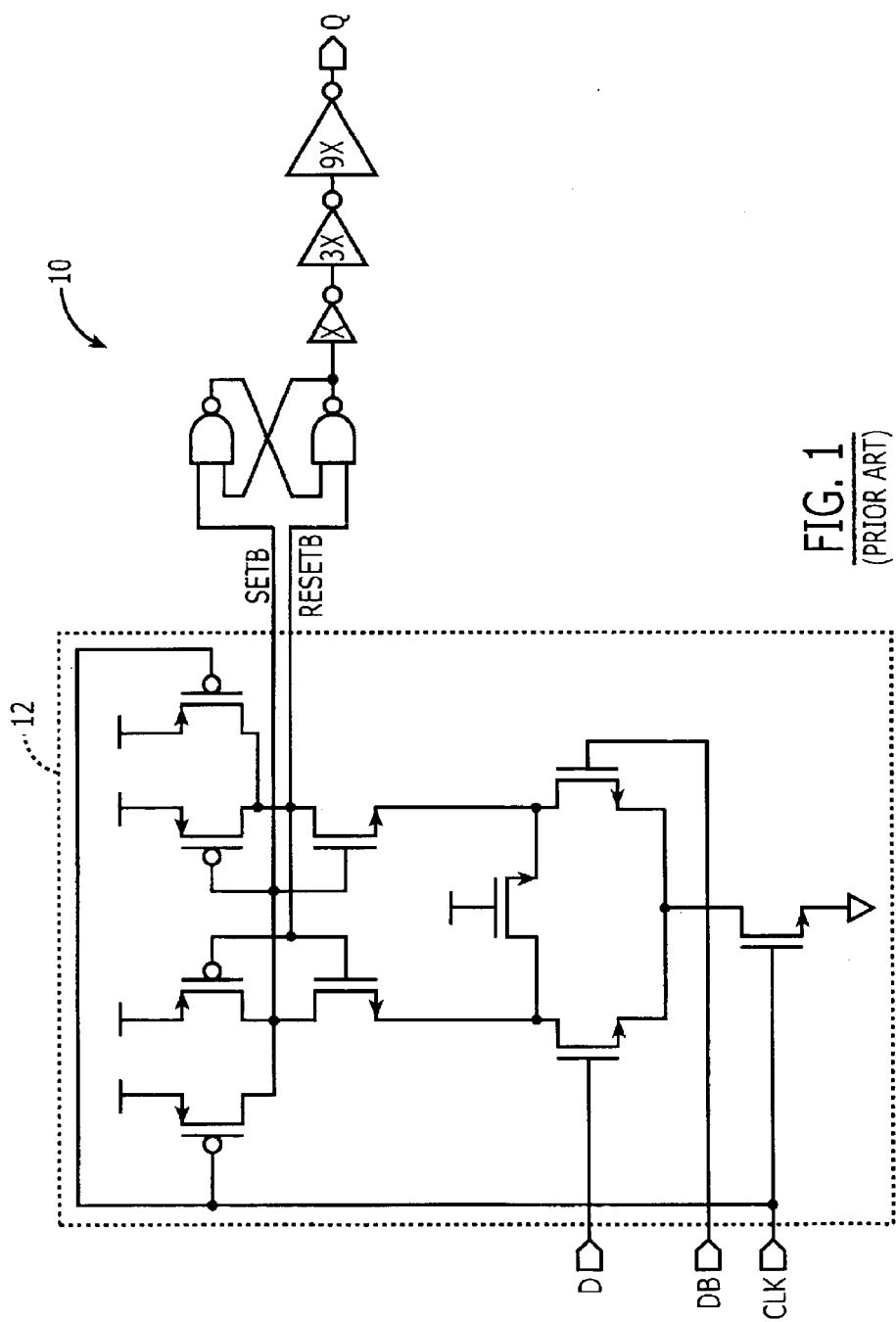
FIG. 1 is an electrical schematic of a D-type flip-flop according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Referring now to FIGS. 2A–2B, a clocked sense amplifier flip-flop 100 according to embodiments of the present invention is responsive to differential data signals, shown as D and DB (=/D), and a clock signal CLK. The flip-flop 100 is also responsive to an active high set signal (SET), which forces an output Q of the flip-flop 100 to a logic 1 level, and an active high reset signal (RESET), which forces the output Q of the flip-flop 100 to a logic 0 level. In FIG. 2B, the flip-flop 100 is illustrated as including four interconnected circuits. These circuits include a differential sense amplifier 110, an edge acceleration stage 120, a tri-state output stage 130 and a data hold circuit 140.

The differential sense amplifier 110 generates first and second output signals, which are shown as "set bar" SB and "reset bar" RB. These signals are treated herein as active low signals. When the clock signal CLK switches high-to-low, both of the output signals SB and RB are pulled high to inactive levels. However, when the clock signal CLK switches low-to-high, the values of the differential data signals D and DB are reflected in the values of the first and second output signals SB and RB. In particular, the receipt of a leading edge of the clock signal CLK, which is treated herein as a low-to-high edge (i.e., rising edge), when D=1 and DB=0, will cause the first output signal SB to switch high-to-low while the second output signal RB remains inactive at a high level. Alternatively, the receipt of a leading edge of the clock signal CLK when D=0 and DB=1, will cause the second output signal RB to switch high-to-low while the first output signal SB remains inactive at a high level. Thereafter, when a trailing edge of the clock signal CLK is received, both the first and second output signals SB and RB are pulled (or held) high. In this manner, the first and second output signals SB and RB represent active low pulses. These pulses have an active duration that is equal to one-half a period of the clock signal CLK.

These first and second output signals SB and RB are provided to an edge acceleration stage 120 having pull-up and pull-down buffers therein. The edge acceleration stage 120 generates active low pull-up control pulses at the output S1B and active high pull-down control pulses at the output R1. The pull-up control pulses S1B are provided to a gate terminal of a PMOS pull-up transistor PU1 within the output stage 130. The pull-down control pulses R1 are provided to a gate terminal of an NMOS pull-down transistor PD1 within the output stage 130. As described more fully hereinbelow, the leading high-to-low edges of the pull-up control pulses S1B and the leading low-to-high edges of the pull-down control pulses R1 are accelerated by the edge acceleration stage 120. The edge acceleration stage 102 performs these acceleration operations by favoring leading high-to-low edges of the first output signal SB relative to low-to-high edges of the first output signal SB and favoring leading high-to-low edges of the second output signal RB relative to low-to-high edges of the second output signal RB.

The output stage 130 operates to pull the output Q of the flip-flop 100 high in response to an active low pull-up control pulse S1B or low in response to an active high pull-down control pulse R1. Otherwise, the output stage 130 is tri-stated when neither the pull-up path defined by PMOS pull-up transistor PU1 nor the pull-down path defined by NMOS pull-down transistor PD1 is conductive. The data hold circuit 140 prevents the output Q of the flip-flop 100 from being disposed in a high impedance state when the output stage 130 is tri-stated. The data hold circuit 140 has an output that is electrically connected to the output Q of the flip-flop 100 and first and second inputs (IN1 and IN2) that are responsive to the pull-up control pulses S1B and the pull-down control pulses R1. The data hold circuit 140 performs a latching function when the pull-up control pulses S1B and pull-down control pulses R1 are both inactive (i.e., whenever S1B=1 and R1=0). This latching function may be performed by cross-coupled logic gates that are relatively easily overcome when the output stage 130 switches the output Q of the flip-flop 100.

Figure 3A:
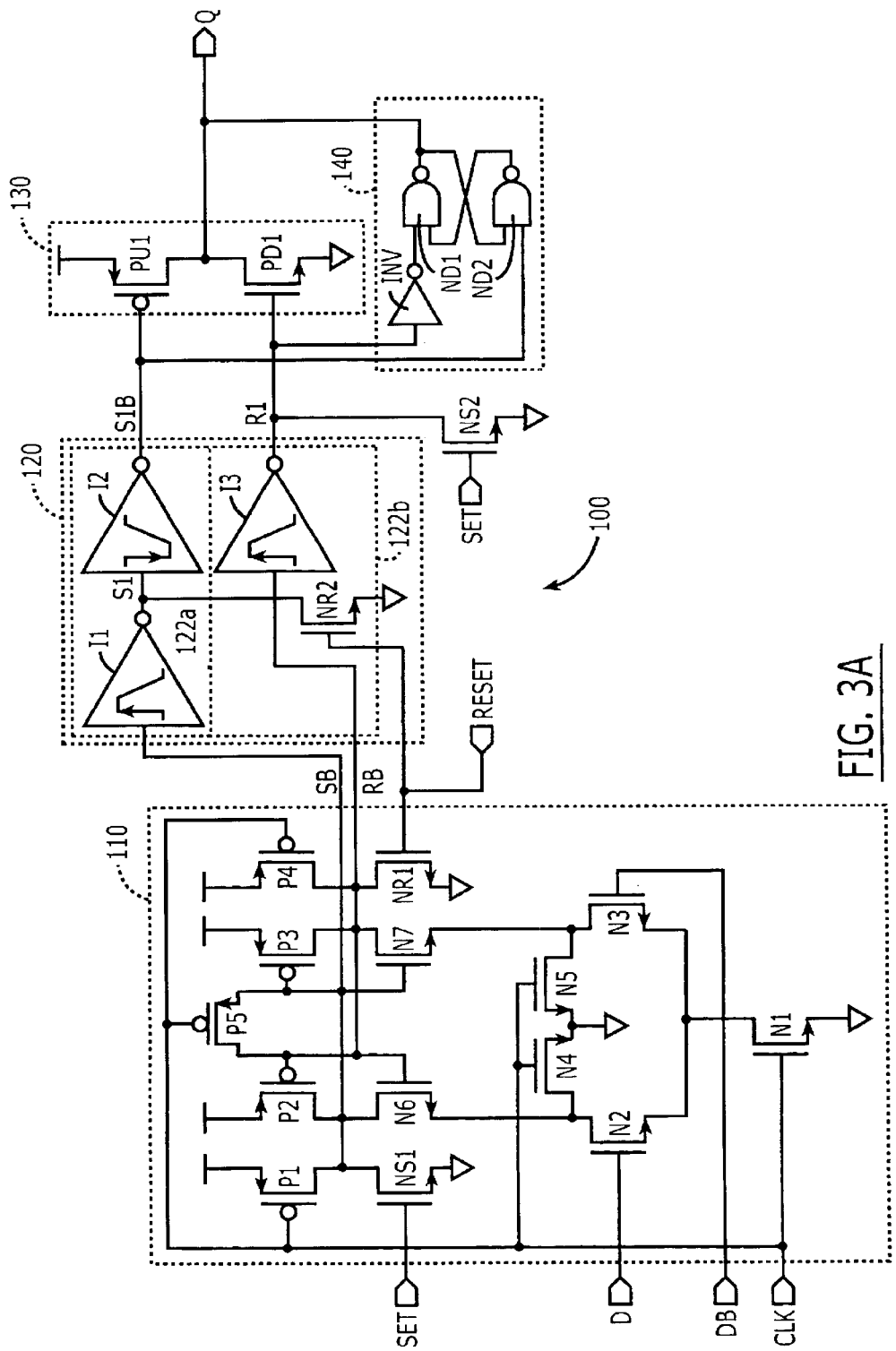
FIG. 3A is a electrical schematic of the D-type flip-flop of FIG. 2B.

One embodiment of the flip-flop of FIG. 2B is illustrated more fully by the electrical schematic of FIG. 3A. In FIG. 3A, the differential sense amplifier 110 is illustrated as including NMOS transistors N1–N7 and PMOS transistors P1–P5. NMOS transistors NS1 and NS2 are provided to support operations to set the flip-flop 100 by driving the first output signal SB and the gate terminal of the pull-down transistor PD1 to low levels when the set signal SET switches high. NMOS transistor NR1 supports operations to reset the flip-flop 100 by driving the second output signal RB to an active low level when the reset signal RESET switches high. The PMOS transistors P1 and P4 operate to pull the first and second outputs SB and RB to inactive high levels when the clock signal CLK is inactive (i.e., CLK=0). When the differential data input signals D and DB are set to 1 and 0, respectively, and a leading edge of the clock signal CLK is received, NMOS transistors N2 and N6 turn on and pull the first output signal SB high-to-low, while the second output signal RB remains high at an inactive level. In contrast, when the differential data input signals D and DB are set to 0 and 1, respectively, and a leading edge of the clock signal CLK is received, NMOS transistors N3 and N7 turn on and pull the second output signal RB high-to-low, while the first output signal SB remains high at an inactive level. To prevent the PMOS transistors P1 and P4 from competing with NMOS transistors NS1 and NR1 during set and reset operations, the clock signal CLK is driven high during a clocked set or reset operation. The NMOS transistors NS1 and NR1 are sufficiently large to overcome any influence of the other transistors within the differential sense amplifier 110 (i.e., overcome the influence of the D and DB input settings when CLK switches low-to-high).

The edge acceleration stage 120 includes a pull-up buffer 122a, a pull-down buffer 122b and an NMOS transistor NR2 that is responsive to the reset signal RESET. The pull-up buffer 122a is illustrated as including an even number of inverters (e.g., 2, 4, . . . ), shown as I1 and I2, and the pull-down buffer 122b is illustrated as including an odd number of inverters (e.g., 1, 3, . . . ), shown as I3. The actual number of inverters in the pull-up buffer 122a influences its delay characteristics and its drive characteristics (i.e., its ability to drive the large PMOS pull-up transistor PU1). Similarly, the actual number of inverters in the pull-down buffer 122b influences its delay characteristics and its drive characteristics (i.e., its ability to drive the large NMOS pull-down transistor PD1). The inverter I1 generates an active high set signal S1 in response to the first output signal SB and the inverter I2 generates the active low pull-up control pulses SIB in response to the set signal S1. The inverter I3 generates an active high reset signal R1 in response to the second output signal RB.

According to preferred aspects of the edge acceleration stage 120, the inverter I1 is configured to accelerate a falling edge of the first output signal SB relative to a rising edge of the first output signal SB. In particular, the inverter I1 has dimensions that are skewed to favor a rising edge of the set signal S1 relative to a falling edge of the set signal S1. This skewing of the output characteristics of the inverter I1 is achieved by making the PMOS pull-up transistor within the inverter I1 much larger than the NMOS pull-down transistor within inverter I1. For example, if a balancing of the $I_{d(sat)}$ characteristics for the PMOS pull-up transistor and the NMOS pull-down transistor within an inverter require a P:N width ratio of $r_w$ for a given fabrication process, where $r_w$ is a positive constant that takes into account the lower majority carrier (i.e., hole) mobility in PMOS transistors relative to NMOS transistors, then the inverter I1 should be designed to have a P:N width ratio of at least $1.75r_w$ to achieve a desired level of edge acceleration. This inverter I1 will be treated herein as being skewed in favor of pull-up by a factor of at least 1.75. In the event the PMOS pull-up and NMOS pull-down transistors have different gate lengths, then the above relationship may be expressed as: $r_w=(Wp/Lp)/(Wn/Ln)$, where Wp and Lp equal the width and length of the PMOS pull-up transistor, respectively, and Wn and Ln equal the width and length of the NMOS pull-down transistor, respectively.

Figures 3B, 3C:
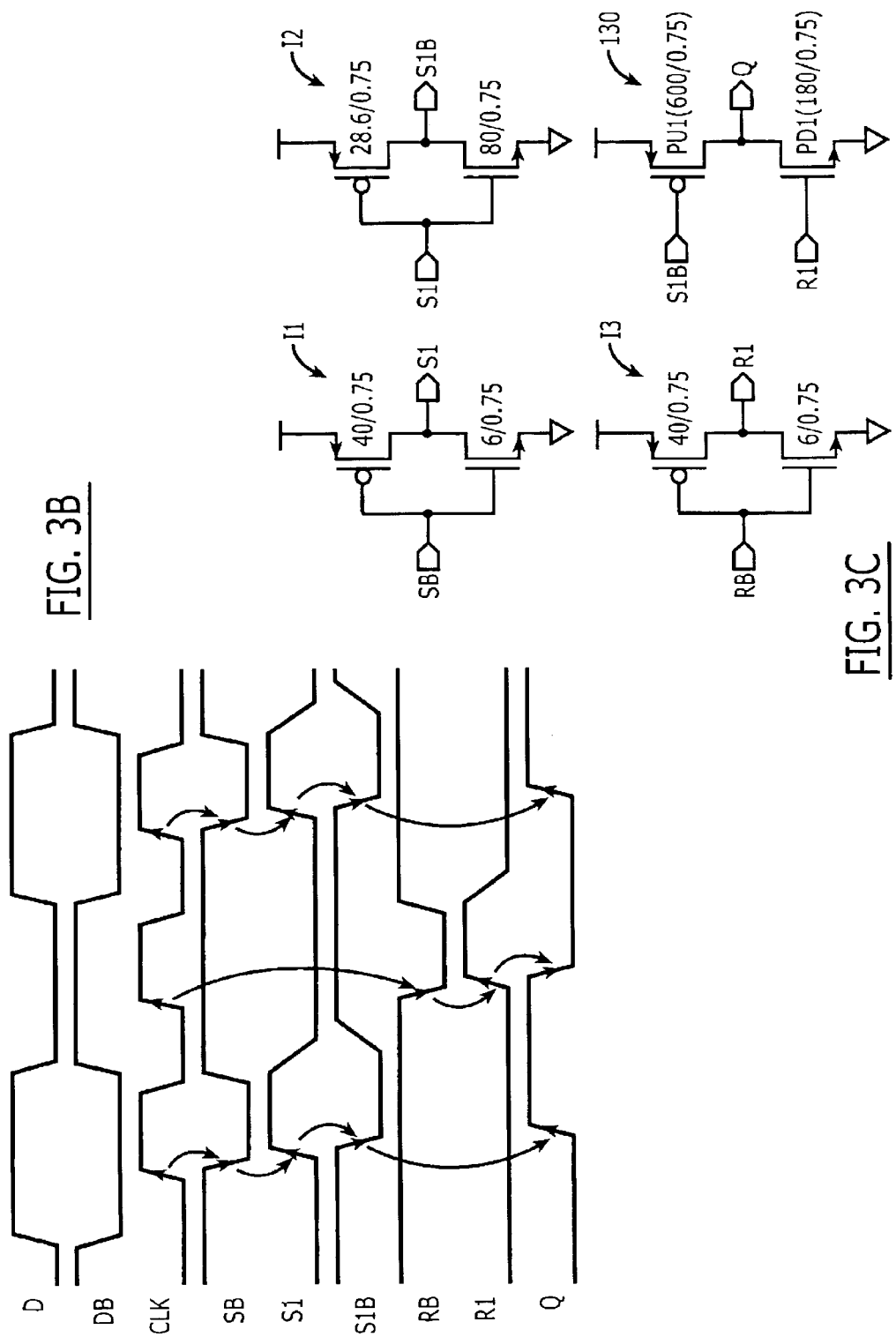
FIG. 3B is a timing diagram that illustrates operation of the D-type flip-flop of FIG. 3A.
FIG. 3C is an electrical schematic of the inverters I1–I3 and output stage illustrated by FIG. 3A.

Thus, as illustrated by FIG. 3C, if $r_w=2.6$ for a given process and the size (width ($\mu$m)/length ($\mu$m)) of the PMOS pull-up transistor equals 40/0.75 and the size of the NMOS pull-down transistor equals 6/0.75, then the P:N width ratio for inverter I1 equals $2.56r_w$ (i.e., $(40/6)=2.56\times(2.6)$). These dimensional relationships also apply to inverter I3, which is shown in FIG. 3C as being identical to inverter I1.

The inverter I2 is configured to accelerate a rising edge of the set signal S1 relative to a falling edge of the set signal S1, which means inverter I2 is skewed to favor a falling edge of each pull-up control pulse S1B relative to a rising edge of each pull-up control pulse S1B. As illustrated by FIG. 3C, if the size of the PMOS pull-up transistor equals 28.6/0.75 and the size of the NMOS pull-down transistor equals 80/0.75, then the N:P width ratio for inverter I2 equals 7.27 (i.e., $7.27=(80(2.6)/28.6)$). This inverter I2 will be treated herein as being skewed in favor of pull-down by a factor of at least 1.75.

These high levels of skew within the inverters I1–I3 are reflected in the timing characteristics of the flip-flop 100. As illustrated by FIG. 3B, a leading edge of the clock signal CLK when D=1 and DB=0 will be reflected in a rising edge of the output signal Q. Here, the rising edge of the clock signal CLK causes the first output signal SB to transition high-to-low while the second output signal RB remains high at an inactive level. The first inverter I1, which is heavily skewed to accelerate a falling edge at its input, drives node S1 low-to-high quickly. The second inverter I2, which is heavily skewed to accelerate a rising edge at its input, drives output S1B high-to-low quickly to thereby turn on the PMOS pull-up transistor PU1 within the output stage 130. This fast turn on of the PMOS pull-up transistor PU1 translates to a rapid low-to-high switching at the output Q of the flip-flop 130. Thereafter, when the clock signal CLK switches high-to-low, the first output signal SB returns to an inactive level, node S1 makes a relatively slow high-to-low transition and output S1B makes a relatively slow low-to-high transition to thereby turn off the PMOS pull-up transistor PU1. This causes the output stage 130 to enter a high impedance state with the output Q being held high by the data hold circuit 140.

Thereafter, a leading edge of the clock signal CLK when D=0 and DB=1 will be reflected in a falling edge of the output signal Q. Here, the rising edge of the clock signal CLK causes the second output signal RB to transition high-to-low while the first output signal SB remains high at an inactive level. The third inverter I3, which is heavily skewed to accelerate a falling edge at its input, drives output R1 low-to-high relatively quickly to thereby turn on the NMOS pull-down transistor PD1 within the output stage 130. This fast turn on of the NMOS pull-down transistor PD1 translates to a rapid high-to-low switching at the output Q of the flip-flop 130. Thereafter, when the clock signal CLK switches high-to-low, the second output signal RB returns to an inactive level and output R1 makes a relatively slow high-to-low transition to thereby turn off the NMOS pull-down transistor PD1. This causes the output stage 130 to enter a high impedance state with the output Q being held low by the data hold circuit 140.

Accordingly, as illustrated by the timing diagram of FIG. 3B and described herein, the use of heavily skewed inverters within the edge acceleration stage 120 operates to shorten the CLK-to-Q timing of the flip-flop 100 by rapidly driving a leading edge of the first output signal SB through the pull-up buffer 122a and driving a leading edge of the second output signal RB through the pull-down buffer 122b. This shorter CLK-to-Q timing is not without a some timing penalty, however, and this penalty operates to limit the maximum frequency at which the flip-flop 100 can be reliably clocked. The timing penalty results from the slower pull-down characteristics associated with inverter I1 (and I3) and the slower pull-up characteristics associated with inverter I2. This means a trailing low-to-high edge of the first output signal SB will pass relatively slowly through the first and second inverters I1 and I2 before turning off the PMOS pull-up transistor PU1. Accordingly, if the clock frequency becomes excessive, a point may be reached where the PMOS pull-up transistor PU1, which is being slowly turned off, is competing against the NMOS pull-down transistor PD1, which is being quickly turned on. To prevent this timing overlap, the frequency of the clock signal CLK can be limited to maintain sufficient timing margin between the switching of the pull-up transistors and the pull-down transistors within the output stage 130.

Referring again to FIG. 3C, the PMOS pull-up transistor PU1 and the NMOS pull-down transistor PD1 are large transistors that support high fanout drive capability. The PMOS pull-up transistor PU1 is illustrated has having a width of 600 microns. To achieve balanced $I_{d(sat)}$ characteristics associated with the pull-up and pull-down paths within the output stage 130 when the width of PU1 equals 600 microns, the NMOS pull-down transistor PD1 should have a width of 230.8 microns (230.8=600/2.6) for the case where $r_w$ equals 2.6. However, to limit the degree of loading on the pull-down buffer 122b when only a single inverter is used (i.e., inverter I3), the width of the NMOS pull-down transistor PD1 may be reduced to 180 microns, as illustrated. This width reduction may eliminate the need to provide two additional inverters within the pull-down buffer 122b, which adds additional gate delays, but this consideration needs to be balanced with the relatively high degree of loading that is placed on inverter I3 and the degree of delay equivalence between the pull-up buffer 122a and pull-down buffer 122b. If two additional inverters are used within the pull-down buffer 122b, then inverter I3 may be used as the first inverter, an inverter equivalent to inverter I2 may be used as a second inverter and an inverter equivalent to inverter I1 may be used as a last inverter.

The output of the data hold circuit 140 switches each time the output Q of the flip-flop 100 switches. The data hold circuit 140 may include relatively weak NAND gates ND1 and ND2 that are easily switched with each transition of the output Q of the flip-flop 100. Nonetheless, after any high fanout load (not shown) is driven high or low by the output stage 130, the data hold circuit 140 operates to hold the state of the output Q until the next time the output stage 130 is switched. When the output stage 130 enters a high impedance state in response to the inputs S1B and R1 being set high and low, respectively, the inverter INV within the data hold circuit 140 will operate to drive one input terminal of the first NAND gate ND1 with a logic 1 value. The signal S1B at the output of the pull-up buffer 122a will also be provided to an input terminal of the second NAND gate ND2. This will enable the latch defined by the cross-coupled NAND gates ND1 and ND2 to hold whatever logic value was last set at the output Q of the flip-flop 100.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated flip-flop device, comprising:
   an output stage having a pull-up path and pull-down path therein that are rendered conductive in response to leading edges of pull-up and pull-down control pulses, respectively;
   a sense amplifier configured to generate first and second data output signals in response to at least one data input signal and a clock signal; and
   an edge acceleration stage configured to generate the pull-up and pull-down control pulses in response to the first and second data output signals, respectively, said edge acceleration stage comprising:
   a pull-up buffer having an even number of inverters therein that are connected in series and alternatingly skewed to accelerate the leading edge of the pull-up control pulse relative to a trailing edge of the pull-up control pulse, wherein a first of the even number of inverters is skewed in favor of its pull-up strength and a last of the even number of inverters is skewed in favor of its pull-down strength; and
   a pull-down buffer having an odd number of inverters therein that are skewed to accelerate the leading edge of the pull-down control pulse relative to a trailing edge of the pull-down control pulse.

2. The flip-flop device of claim 1, wherein the pull-up path within said output stage comprises a PMOS pull-up transistor and the pull-down path within said output stage comprises an NMOS pull-down transistor; and wherein the PMOS pull-up transistor and the NMOS pull-down transistor have about equal pull-up and pull-down strengths.

3. The flip-flop device of claim 2, wherein a ratio of a width of the PMOS pull-up transistor to a width of the NMOS pull-down transistor equals $r_w$;
   and wherein at least one of the pull-up buffer and the pull-down buffer has an inverter therein with a PMOS-to-NMOS transistor width ratio greater than about $1.75r_w$.

4. The flip-flop device of claim 1, wherein said sense amplifier comprises a differential amplifier that is configured to drive the first and second data output signals at inactive levels in response to a trailing edge of the clock signal.

5. The flip-flop device of claim 1, wherein said pull-down buffer consists of an odd number of inverters; and wherein a first of the odd number of inverters is skewed in favor of its pull-up strength.

6. The flip-flop device of claim 1, wherein said pull-down buffer consists of an odd number of inverters; wherein a first of the odd number of inverters is skewed in favor of its pull-up strength; and wherein a last of the odd number of inverters is skewed in favor of its pull-up strength.

7. The flip-flop device of claim 1, wherein the first of the even number of inverters is skewed in favor of its pull-up strength by a factor of at least 1.75; and wherein the last of the even number of inverters is skewed in favor of its pull-down strength by a factor of at least 1.75.

8. The flip-flop device of claim 7, wherein said pull-down buffer consists of an odd number of inverters; and wherein a first of the odd number of inverters is skewed in favor of its pull-up strength by a factor of at least 1.75.

9. The flip-flop device of claim 7, wherein said pull-down buffer consists of an odd number of inverters; wherein a first of the odd number of inverters is skewed in favor of its pull-up strength by a factor of at least 1.75; and wherein a last of the odd number of inverters is skewed in favor of its pull-up strength by a factor of at least 1.75.

10. An integrated flip-flop device, comprising:
an output stage having a pull-up path and pull-down path therein that are rendered conductive in response to leading edges of pull-up and pull-down control pulses, respectively;
a sense amplifier configured to generate first and second data output signals in response to at least one data input signal and a clock signal; and
an edge acceleration stage configured to generate the pull-up and pull-down control pulses in response to the first and second data output signals, respectively, said edge acceleration stage comprising:
a pull-up buffer having an even (odd) number of inverters therein that are skewed to accelerate the leading edge of the pull-up control pulse relative to a trailing edge of the pull-up control pulse; and
a pull-down buffer having an odd (even) number of inverters therein that are skewed to accelerate the leading edge of the pull-down control pulse relative to a trailing edge of the pull-down control pulse; and
a data hold circuit having an output that is electrically coupled to an output of said output stage and first and second inputs that are responsive to the pull-up and pull-down control pulses.

11. The flip-flop device of claim 10, wherein the pull-up path within said output stage comprises a PMOS pull-up transistor and the pull-down path within said output stage comprises an NMOS pull-down transistor; wherein a ratio of a width of the PMOS pull-up transistor to a width of the NMOS pull-down transistor equals $r_w$; and wherein at least one of the pull-up buffer and the pull-down buffer has an inverter therein with a PMOS-to-NMOS transistor width ratio greater than about $1.75r_w$.

12. An integrated sense amplifier flip-flop device, comprising:
an output driver comprising a totem pole arrangement of a PMOS pull-up transistor and an NMOS pull-down transistor that are electrically connected together at an output of said output driver;
a data hold circuit having a first input electrically coupled to a gate terminal of the PMOS pull-up transistor, a second input electrically coupled to a gate terminal of the NMOS pull-down transistor and an output electrically connected to the output of said output driver;
a clocked sense amplifier having at least one data input and first and second data outputs;
an edge accelerating pull-up buffer having an input connected to the first data output of said clocked sense amplifier and an output that is electrically connected to the gate terminal of the PMOS pull-up transistor; and
an edge accelerating pull-down buffer having an input connected to the second data output of said clocked sense amplifier and an output that is electrically connected to the gate terminal of the NMOS pull-down transistor.

13. The flip-flop device of claim 12, wherein said edge accelerating pull-up buffer comprises an even number of inverters that are each skewed by a factor of at least 1.75.

14. The flip-flop device of claim 13, wherein said edge accelerating pull-down buffer comprises an odd number of inverters that are each skewed by a factor of at least 1.75.

15. A sense amplifier flip-flop device, comprising:
an output driver stage having a pair of non-opposing pull-up and pull-down transistors therein;
an edge acceleration stage configured to drive the pull-up transistor with a first pulse having skewed edges that favor turn-on of the pull-up transistor when setting an output of the flip-flop device high in-sync with a clock signal and further configured to drive the pull-down transistor with a second pulse having skewed edges that favor turn-on of the pull-down transistor when setting the output of the flip-flop device low in-sync with the clock signal; and
a data hold circuit having an output electrically coupled to the output of said output driver stage and first and second inputs responsive to the first and second pulses, respectively.

16. The device of claim 15, wherein said edge accelerating stage comprises a pull-up buffer having an even number of inverters therein that are each skewed by a factor of at least 1.75.

17. The device of claim 16, wherein said edge accelerating stage comprises a pull-down buffer having an odd number of inverters therein that are each skewed by a factor of at least 1.75.

18. The device of claim 17, wherein said sense amplifier flip-flop device comprises a differential amplifier that is configured to drive the pull-up and pull-down buffers with active low signals, in response to a pair of complementary data input signals.

19. An integrated flip-flop device, comprising:
an output stage having a pull-up path and pull-down path therein that are rendered conductive in response to leading edges of pull-up and pull-down control pulses, respectively, which are synchronized with a clock signal;
a sense amplifier configured to generate first and second data output signals in response to at least one data input signal and the clock signal; and
an edge acceleration stage configured to generate the pull-up and pull-down control pulses in response to the first and second data output signals, respectively, said edge acceleration stage comprising:
a pull-up buffer having an even (odd) number of serially-connected inverters therein that are alternatingly skewed to accelerate the leading edge of the pull-up control pulse relative to a trailing edge of the pull-up control pulse; and
a pull-down buffer having an odd (even) number of inverters therein that are skewed to accelerate the leading edge of the pull-down control pulse relative to a trailing edge of the pull-down control pulse.

20. The flip-flop device of claim 19, further comprising a data hold circuit having an output electrically coupled to an output of said output stage and first and second inputs responsive to the pull-up and pull-down control pulses, respectively.

* * * * *